United States Patent
Dighrasker et al.

(10) Patent No.: US 9,800,245 B2
(45) Date of Patent: Oct. 24, 2017

(54) BIPOLAR GATE DRIVER

(71) Applicant: SCHNEIDER ELECTRIC IT CORPORATION, West Kingston, RI (US)

(72) Inventors: Milind Dighrasker, Bangalore (IN); Mahendrakumar Haribhau Lipare, Bangalore (IN); Rajesh Ghosh, Bangalore (IN)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 0 days.

(21) Appl. No.: 15/114,173

(22) PCT Filed: Jan. 28, 2014

(86) PCT No.: PCT/US2014/013358
§ 371 (c)(1),
(2) Date: Jul. 26, 2016

(87) PCT Pub. No.: WO2015/116031
PCT Pub. Date: Aug. 6, 2015

(65) Prior Publication Data
US 2017/0012626 A1    Jan. 12, 2017

(51) Int. Cl.
*H02M 3/07* (2006.01)
*H03K 17/08* (2006.01)
(Continued)

(52) U.S. Cl.
CPC ...... *H03K 19/017509* (2013.01); *H02M 3/07* (2013.01); *H03K 17/08* (2013.01);
(Continued)

(58) Field of Classification Search
CPC .......... H03K 19/017509; H03K 17/08; H03K 17/687; H03K 19/0016; H03K 2217/0063; H03K 2217/0072; H02M 3/07
(Continued)

(56) References Cited

U.S. PATENT DOCUMENTS 5,483,486 A    1/1996 Javanifard et al.
5,502,412 A *  3/1996 Choi ..................... H02M 7/538
                                                    327/112
(Continued)

FOREIGN PATENT DOCUMENTS

EP    2632046 A1    8/2013

OTHER PUBLICATIONS

Notification of Transmittal of the International Search Report and the Written Opinion of the International Searching Authority from corresponding PCT/US2014/013358 dated May 19, 2014.
(Continued)

*Primary Examiner* — Brandon S Cole
(74) *Attorney, Agent, or Firm* — Lando & Anastasi, LLP (57) ABSTRACT

According to one aspect, embodiments of the invention provide a gate driver comprising a level shifter circuit configured to be coupled to a controller, to receive control signals from the controller, each control signal having a voltage with respect to a control ground, and to redefine the voltage of each control signal with respect to a chip ground to generate redefined control signals, a gate driver chip coupled to the level shifter circuit and configured to be coupled to at least one semiconductor device, the gate driver chip further configured to provide bipolar control signals to the at least one semiconductor device based on the redefined control signals, and at least one power source configured to provide at least one positive supply voltage to the gate driver
(Continued)

chip and at least one negative supply voltage to the gate driver chip and to the chip ground.

14 Claims, 5 Drawing Sheets

(51) Int. Cl.
 *H03K 17/687* (2006.01)
 *H03K 19/0175* (2006.01)
 *H03K 19/00* (2006.01)
(52) U.S. Cl.
 CPC ....... *H03K 17/687* (2013.01); *H03K 19/0016* (2013.01); *H03K 2217/0063* (2013.01); *H03K 2217/0072* (2013.01)
(58) Field of Classification Search
 USPC ............... 327/108–112, 379, 389, 391, 333; 326/22–27, 62–87; 365/189.11
 See application file for complete search history.

(56) References Cited

U.S. PATENT DOCUMENTS

| | | | |
|---|---|---|---|
| 5,532,653 A | 7/1996 | Adkins | |
| 6,201,429 B1* | 3/2001 | Rosenthal | H03K 19/0013 326/62 |
| 6,211,706 B1* | 4/2001 | Choi | H03K 17/063 327/108 |
| 6,369,612 B1* | 4/2002 | Shokouhi | H03K 19/018521 326/68 |
| 6,556,053 B2* | 4/2003 | Stanley | H02M 1/08 318/293 |
| 6,657,399 B2* | 12/2003 | Adams | H02M 1/38 315/224 |
| 6,759,692 B1* | 7/2004 | Ochi | H02M 1/08 257/107 |
| 6,885,225 B2* | 4/2005 | Ohmichi | H02M 7/538 327/108 |
| 7,248,093 B2 | 7/2007 | West | |
| 7,259,613 B2 | 8/2007 | Meek et al. | |
| 7,388,422 B2* | 6/2008 | Khan | H02M 3/07 327/112 |
| 7,492,618 B2* | 2/2009 | Matsuda | H02M 7/538 363/56.01 |
| 8,427,235 B2 | 4/2013 | Williams | |
| 2007/0195563 A1* | 8/2007 | Shiraishi | H01L 24/49 363/25 |
| 2008/0205100 A1 | 8/2008 | Sakamoto | |
| 2009/0085648 A1 | 4/2009 | Maes et al. | |
| 2011/0156628 A1 | 6/2011 | Summer | |
| 2012/0189139 A1 | 7/2012 | Ohara et al. | |
| 2013/0265029 A1* | 10/2013 | Akiyama | H03K 17/94 323/311 |
| 2014/0375292 A1* | 12/2014 | Kihara | H02M 1/08 323/283 |

OTHER PUBLICATIONS

Extended European Search Report from corresponding European Application No. 14881198.7 dated Sep. 1, 2017.
Lira: "Optimization of a back bias generator for NMOS VLSI", Jun. 7, 1988; Jun. 7, 1988-Jun. 9, 1988, Jun. 7, 1988 (Jun. 7, 1988), pp. 1601-1606, XP010069216.

* cited by examiner

BIPOLAR GATE DRIVER

CROSS-REFERENCE TO RELATED APPLICATIONS

This application is a U.S. National Stage Application under 35 U.S.C. §371 of International Application No. PCT/US2014/013358, filed Jan. 28, 2014, titled BIPOLAR GATE DRIVER, which is hereby incorporated herein by reference in its entirety.

BACKGROUND OF INVENTION

1. Field of Invention

The present invention relates generally to gate drivers.

2. Discussion of Related Art

A gate driver is a power amplifier that accepts a low-power input from a controller and produces a high-current drive input for the gate of a transistor such as an Insulated Gate Bipolar Transistor (IGBT) or a Metal-Oxide-Semiconductor Field-Effect-Transistor (MOSFET). Gate drivers are widely used in power converter applications such as half/full bridge inverters and half/full bridge converters.

SUMMARY OF INVENTION

At least one aspect of the invention is directed to a gate driver, the gate driver comprising a level shifter circuit configured to be coupled to a controller, to receive control signals from the controller, each control signal having a voltage with respect to a control ground, and to redefine the voltage of each control signal with respect to a chip ground to generate redefined control signals, a gate driver chip coupled to the level shifter circuit and configured to be coupled to at least one semiconductor device, the gate driver chip further configured to provide bipolar control signals to the at least one semiconductor device based on the redefined control signals, and at least one power source coupled to the gate driver chip and the chip ground and configured to provide at least one positive supply voltage to the gate driver chip and at least one negative supply voltage to the gate driver chip and to the chip ground.

According to one embodiment, the at least one power source includes at least one positive power supply coupled to the gate driver chip and configured to provide the at least one positive supply voltage to the gate driver chip, and at least one negative power supply coupled to the gate driver chip and the chip ground and configured to provide the at least one negative supply voltage to the gate driver chip and the chip ground. In one embodiment, the gate driver chip includes a high side driver coupled to the level shifter circuit and configured to be coupled to a first semiconductor device, the high side driver further configured to provide first bipolar control signals to the first semiconductor device based on the redefined control signals, and a low side driver coupled to the level shifter circuit and configured to be coupled to a second semiconductor device, the low side driver further configured to provide second bipolar control signals to the second semiconductor device based on the redefined control signals.

According to one embodiment, the at least one positive power supply includes a first positive power supply coupled to the high side driver and configured to provide a first positive supply voltage to the high side driver, and a second positive power supply coupled to the low side driver and configured to provide a second positive supply voltage to the low side driver, and the at least one negative power supply includes a first negative power supply coupled to the high side driver and configured to provide a first negative supply voltage to the high side driver, and a second negative power supply coupled to the low side driver and the chip ground and configured to provide a second negative supply voltage to the low side driver and the chip ground.

According to another embodiment, the at least one power source includes at least one positive power supply coupled to the gate driver chip and configured to provide the at least one positive supply voltage to the gate driver chip, and a first charge pump circuit coupled to the at least one positive power supply, the gate driver chip, and the chip ground, the first charge pump circuit configured to generate a first negative supply voltage from the at least one positive supply voltage and provide the first negative supply voltage to the gate driver chip and to the chip ground. In one embodiment, the gate driver chip includes a high side driver coupled to the level shifter circuit and having a first output configured to be coupled to a first semiconductor device, the high side driver further configured to provide first bipolar control signals to the first semiconductor device via the first output based on the redefined control signals, and a low side driver coupled to the level shifter circuit and having a second output configured to be coupled to a second semiconductor device, the low side driver further configured to provide second bipolar control signals to the second semiconductor device via the second output based on the redefined control signals, wherein the first charge pump circuit is coupled to the low side driver and configured to provide the first negative supply voltage to the low side driver.

According to one embodiment, the at least one power source further includes a second charge pump circuit coupled to the at least one positive power supply and the high side driver, the second charge pump circuit configured to generate a second negative supply voltage from the at least one positive supply voltage and provide the second negative supply voltage to the high side driver. In one embodiment, the first charge pump circuit is coupled to a first positive power supply and configured to generate the first negative supply voltage from a first positive supply voltage provided by the first positive power supply, and the second charge pump circuit is coupled to a second positive power supply and configured to generate the second negative supply voltage from a second positive supply voltage provided by the second positive power supply. In another embodiment, the first charge pump circuit is coupled to a positive power supply and configured to generate the first negative supply voltage from a positive supply voltage provided by the positive power supply, and the second charge pump circuit is coupled to the positive power supply and configured to generate the second negative supply voltage from the positive supply voltage provided by the positive power supply.

According to one embodiment, the first charge pump circuit comprises a first capacitor coupled to the second output, a switch coupled between the second output and the first capacitor, and a second capacitor coupled to the first capacitor and to the chip ground, wherein in a first mode of operation, the switch is turned off by high control signals at the second output and the first capacitor is charged by the high control signals, and wherein in a second mode of operation, the switch is turned on by low control signals at the second output, the first capacitor discharges, and discharged energy from the first capacitor charges the second capacitor, generating the first negative supply voltage on the chip ground. In another embodiment, the first charge pump circuit comprises an oscillator coupled to the at least one positive power supply, a first capacitor coupled to the oscillator, and a second capacitor coupled to the first capacitor and to the chip ground, wherein in a first mode of operation, the oscillator provides a high pulse signal to the first capacitor and the first capacitor is charged by the high pulse signal, and wherein in a second mode of operation, the oscillator provides a low pulse signal to the first capacitor, the first capacitor discharges, and discharged energy from the first capacitor charges the second capacitor, generating the first negative supply voltage on the chip ground.

Another aspect of the invention is directed to a method for operating a gate driver chip coupled to at least one semiconductor device, the method comprising receiving control signals from a controller, each control signal having a voltage with respect to a control ground, redefining the voltage of each control signal with respect to a chip ground to generate redefined control signals, generating, with the gate driver chip based on the redefined control signals, bipolar control signals, providing the bipolar control signals to the at least one semiconductor device, and providing, with at least one power source, at least one positive supply voltage to the gate driver chip and at least one negative supply voltage to the gate driver chip and to the chip ground.

According to one embodiment, providing at least one positive supply voltage to the gate driver chip includes providing a first positive supply voltage to a high side driver of the gate driver chip and providing a second positive supply voltage to a low side driver of the gate driver chip. In one embodiment, providing the first positive supply voltage to the high side driver of the gate driver chip includes bootstrapping the second positive supply voltage to generate the first positive supply voltage. In another embodiment, providing at least one negative supply voltage to the gate driver chip and to the chip ground includes providing a first negative supply voltage to the high side driver of the gate driver chip and providing a second negative supply voltage to the low side driver of the gate driver chip and to the chip ground.

According to another embodiment, providing a second negative supply voltage to the low side driver of the gate driver chip and to the chip ground includes operating a charge pump circuit to generate the second negative supply voltage from the second positive supply voltage. In one embodiment, operating a charge pump circuit includes charging, in a first mode of operation, a first capacitor in the charge pump circuit, discharging, in a second mode of operation, the first capacitor, charging, in the second mode of operation, a second capacitor in the charge pump circuit with discharged energy from the first capacitor, and generating, with the charged second capacitor, the second negative supply voltage. In one embodiment, charging the first capacitor in the charge pump circuit includes charging the first capacitor with energy from an output of the low side driver. In another embodiment, charging the first capacitor in the charge pump circuit includes charging the first capacitor with energy from an oscillator in the charge pump circuit.

One aspect of the invention is directed to a gate driver, the gate driver comprising a gate driver chip configured to be coupled to a controller and configured to be coupled to at least one semiconductor device, and means for operating the gate driver chip to provide bipolar control signals to the at least one semiconductor device based on unipolar control signals received from the controller and for providing at least one positive supply voltage and at least one negative supply voltage to the gate driver chip derived from a voltage from a single power supply.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

Figure 1:
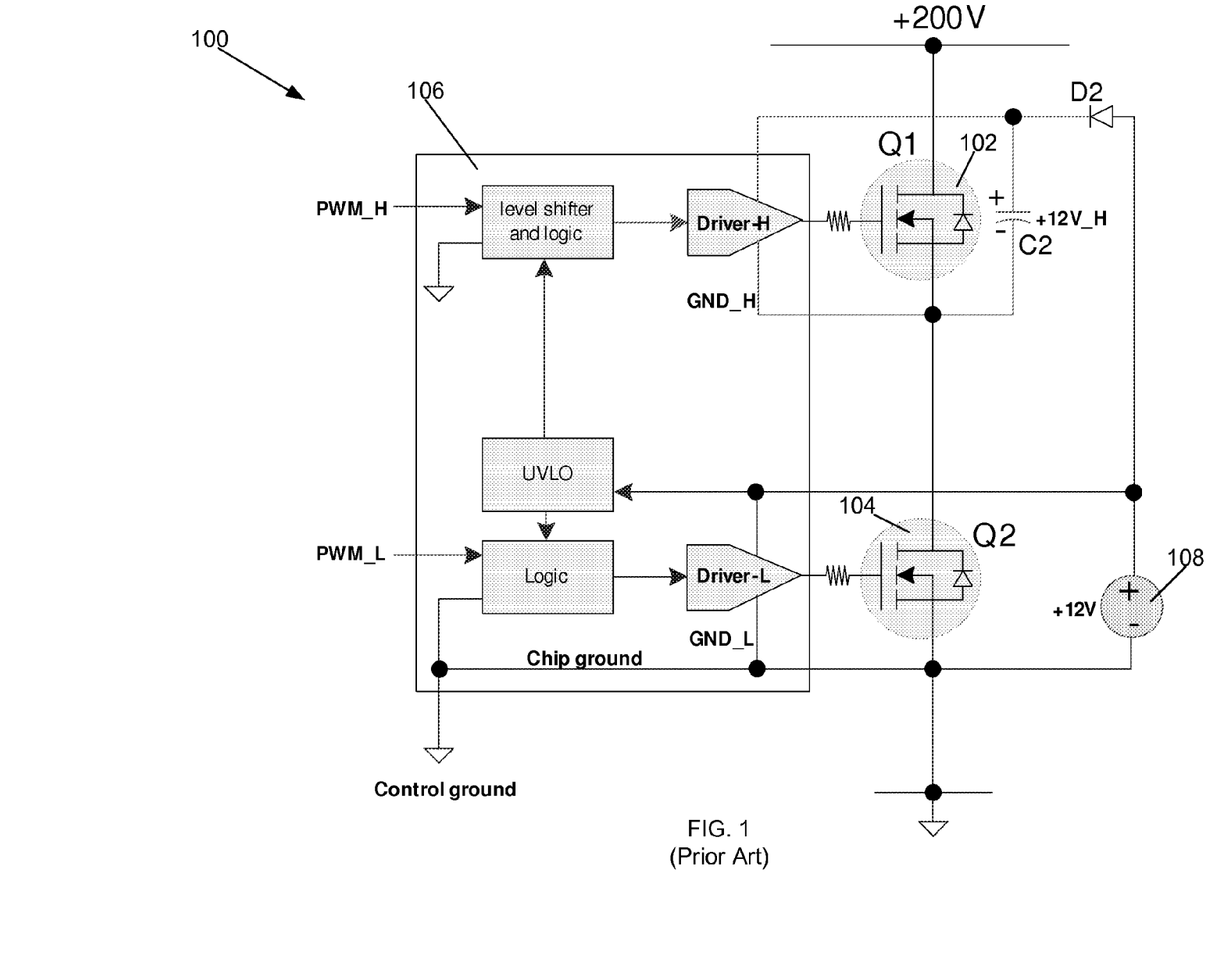
FIG. 1 is a block diagram of a common gate driver.

As discussed above, gate drivers are widely used in converter applications such as half/full bridge inverters and half/full bridge converters. For example, FIG. 1 is a block diagram of a common gate driver 100. The common gate driver 100 drives two semiconductor devices (Q1 102 and Q2 104) of a converter/inverter leg with a standard (and relatively inexpensive) high and low side driver chip 106. The gate driver 100 utilizes a single power supply 108 (+12V with respect to ground). The DC voltage required for the semiconductor device Q2 104 is provided directly from the power supply 108. The DC voltage required for the semiconductor device Q1 102 is derived from the power supply 108 using a bootstrap technique. The driver chip 106 provides unipolar Pulse Width Modulation (PWM) pulses (+12V/0V) across the gate and source terminals of each semiconductor device (Q1 102 and Q2 104). For example, the driver chip 106 applies a +12V gate voltage to turn on a semiconductor device and applies a zero gate voltage to turn off (and keep off) a semiconductor device. By turning the semiconductor devices on and off, the driver chip 106 controls the output of the converter/inverter.

With the advancement of power semiconductor device technology, new generation power switching devices such as Metal-Oxide-Semiconductor Field-Effect Transistors (MOSFET), CoolMOS transistors, Super junction MOS-FETs, and Silicon Carbide (SiC)/Gallium Nitride (GaN) High-Electron-Mobility Transistors (HEMT), have very low gate threshold voltages (e.g., between 1V to 2V) and very high switching rates of change (dv/dt) in the drain to source voltage. A high rate of change (dv/dt) in the drain to source voltage may cause oscillations in the gate voltage of an off semiconductor device due to switching (on/off) of a complementary device. Since the gate voltage is zero in the off device, the oscillations may cause the gate voltage to exceed the gate threshold voltage (e.g., <2V), leading to a shoot-through fault in the off leg of the converter/inverter.

A negative gate voltage is used in at least some embodiments described herein to ensure proper device turn off and reliable operation of a converter/inverter. A bipolar gate driver which utilizes a relatively inexpensive standard high and low side driver chip is described herein. According to at least one embodiment, the bipolar gate driver utilizes charge pump circuits to generate negative supply voltages from positive power supplies.

Figure 2:
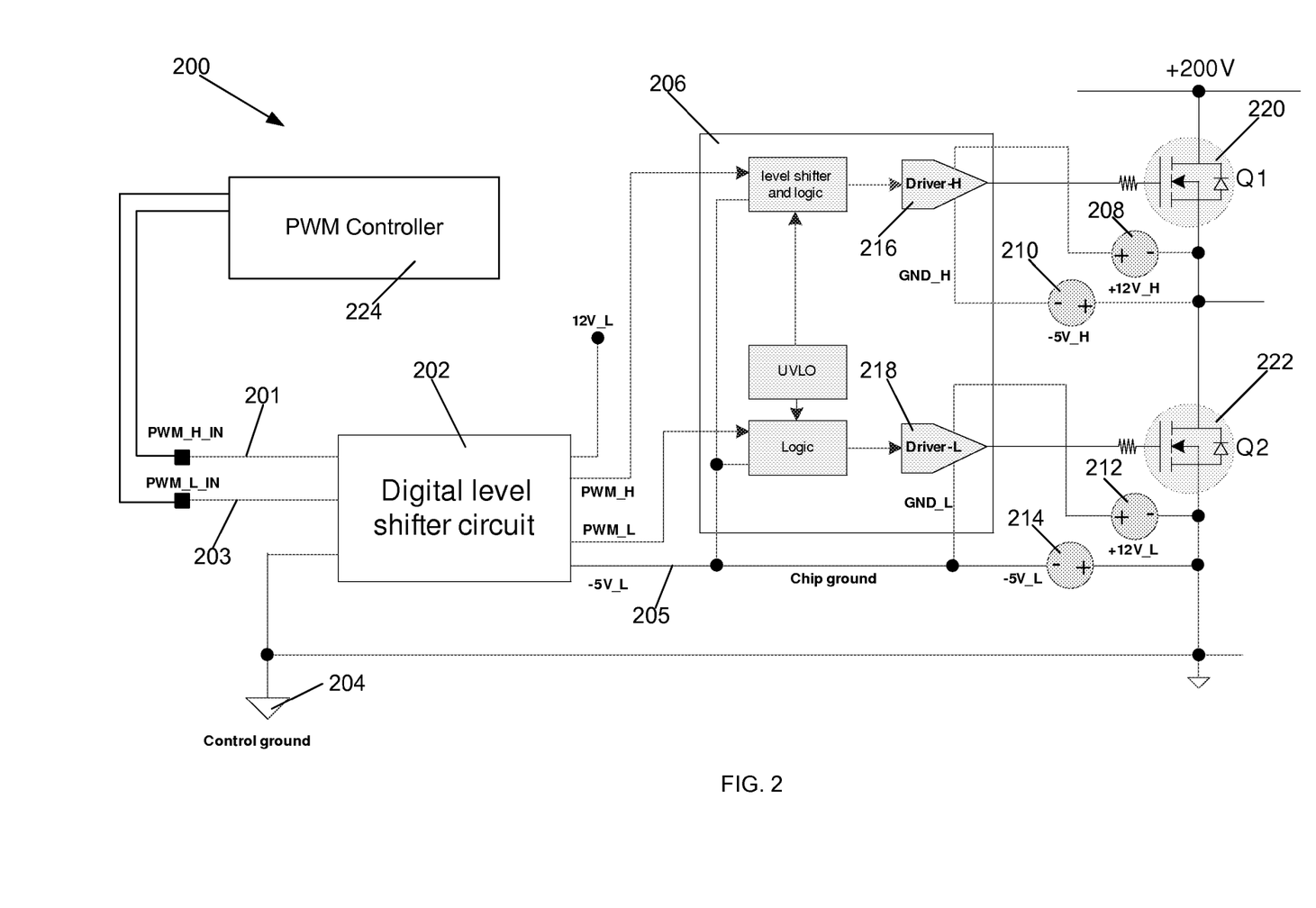
FIG. 2 is a block diagram of a bipolar gate driver according to aspects of the present invention.

FIG. 2 is a block diagram of a bipolar gate driver 200. The bipolar gate driver 200 includes a high and low side driver chip 206, a digital level shifter circuit 202, a control ground 204, a chip ground 205, a high side +12V power supply 208, a high side −5V power supply 210, a low side +12V power supply 212, and a low side −5V power supply 214. According to one embodiment, the high and low side driver chip 206 is a FAN7390MX Gate-Drive IC manufactured by Fairchild Semiconductor Corporation of San Jose, Calif. In another embodiment, the high and low side driver chip 206 is an IRS2001(S)PbF high and low side driver manufactured by International Rectifier of El Segundo, Calif. In other embodiments, another type of high and low side driver chip may be utilized.

The digital level shifter circuit 202 is configured to be coupled to a PWM controller 224 via a PWM high side control line 201 and a PWM low side control line 203. The digital level shifter circuit 202 is also coupled to control ground 204 and chip ground 205. A high side input and a low side input of the driver chip 206 are coupled to the digital level shifter circuit 202. An output of a high side driver 216 of the driver chip 206 is coupled to a gate terminal of a semiconductor device (Q1) 220 of a converter/inverter leg. An output of a low side driver 218 of the driver chip 206 is coupled to a gate terminal of a semiconductor device (Q2) 222 of a converter/inverter leg.

A positive terminal of the high side +12V power supply 208 is coupled to a supply input of the high side driver 216 of the driver chip 206 and provides +12V to the supply input. A negative terminal of the high side −5V power supply is coupled to a ground input of the high side driver 216 and provides −5V to the ground input. A negative terminal of the high side +12V power supply 208 and a positive terminal of the high side −5V power supply are coupled to a source terminal of the semiconductor device (Q1) 220. A positive terminal of the low side +12V power supply 212 is coupled to a supply input of the low side driver 218 of the driver chip 206 and provides +12V to the supply input. A negative terminal of the low side −5V power supply 214 is coupled to a ground input of the low side driver 218 and provides −5V to the ground input. The negative terminal of the low side +12V power supply 212 and a positive terminal of the low side −5V power supply 214 are coupled to a source terminal of the semiconductor device (Q2) 222.

Unlike the common gate driver shown in FIG. 1, the chip ground 205 of the gate driver 200 is not connected to the control ground 204 but is instead connected to the low side −5V power supply 214. According to one embodiment, the high side +12V power supply 208, high side −5V power supply 210, low side +12V power supply 212, and/or low side −5V power supply 214 are separate power supplies; however, in other embodiments, the high side and/or low side supply voltages may be generated as discussed in greater detail below.

The PWM controller 224 provides PWM control signals (defined with respect to control ground 204 (e.g., at 0V)) to the PWM high side control line 201 and the PWM low side control line 203 to control the output of the gate driver 200 (and the output of the corresponding converter/inverter). The digital level shifter circuit 202 receives the PWM control signals from the PWM controller 224, redefines the PWM control signals with respect to chip ground 205 (e.g., at −5V), and provides the redefined PWM control signals to the driver chip 206.

According to one embodiment, the digital level shifter circuit 202 includes a comparator chip. For example, in one embodiment, the digital level shifter circuit 202 includes a LM339 Quad Differential Comparator manufactured by Texas Instruments Inc. of Dallas, Tex.; however, in other embodiments, other comparators may be utilized. In another embodiment, the digital level shifter circuit 202 includes an analog MUX chip. For example, in one embodiment, the digital level shifter circuit 202 includes a CD4051/2/3 CMOS Analog Multiplexer manufactured by Texas Instruments Inc. of Dallas, Tex.; however, in other embodiments, other analog MUX chips may be utilized. According to other embodiments, other level shifter circuits may be utilized to redefine the PWM control signals with respect to chip ground 205.

Based on the redefined PWM control signals received from the digital level shifter circuit 202, the driver chip 206 operates the high side driver 216 and the low side driver 218 to provide desired control pulses to the gate terminal of each semiconductor device 220, 222. In driving the driver chip 206 with PWM control signals redefined with respect to chip ground 205, the driver chip 206 (which typically provides unipolar pulses (+12V/0V)) may instead be operated to provide bipolar pulses (+12V/−5V) across the gate and source terminals of each semiconductor device (Q1 220 and Q2 222). For example, in response to the redefined PWM control signals received from the digital level shifter circuit 202 (based on original PWM control signals received from the PWM controller 224), the driver chip 206 operates a driver 216, 218 to apply +12V to the gate terminal of a semiconductor device 220, 222 to turn on the semiconductor device 220, 222 or −5V to the gate terminal of a semiconductor device 220, 222 to turn off (and keep off) the semiconductor device 220, 222.

By turning the semiconductor devices 220, 222 on and off (with the +12V and −5V gate voltages), the driver chip 206 controls the output of the converter/inverter. By utilizing bipolar gate voltages to control the states of the semiconductor devices 220, 222, the driver chip 106 may prevent accidental shoot-through faults in the off leg of the converter/inverter due to oscillations in the gate voltages of the semiconductor devices. Oscillations in the gate voltages of the semiconductor devices will likely not exceed the gate threshold voltage (e.g., 2V) of an off semiconductor device as the gate voltage of an off semiconductor device is held at −5V.

Figure 3:
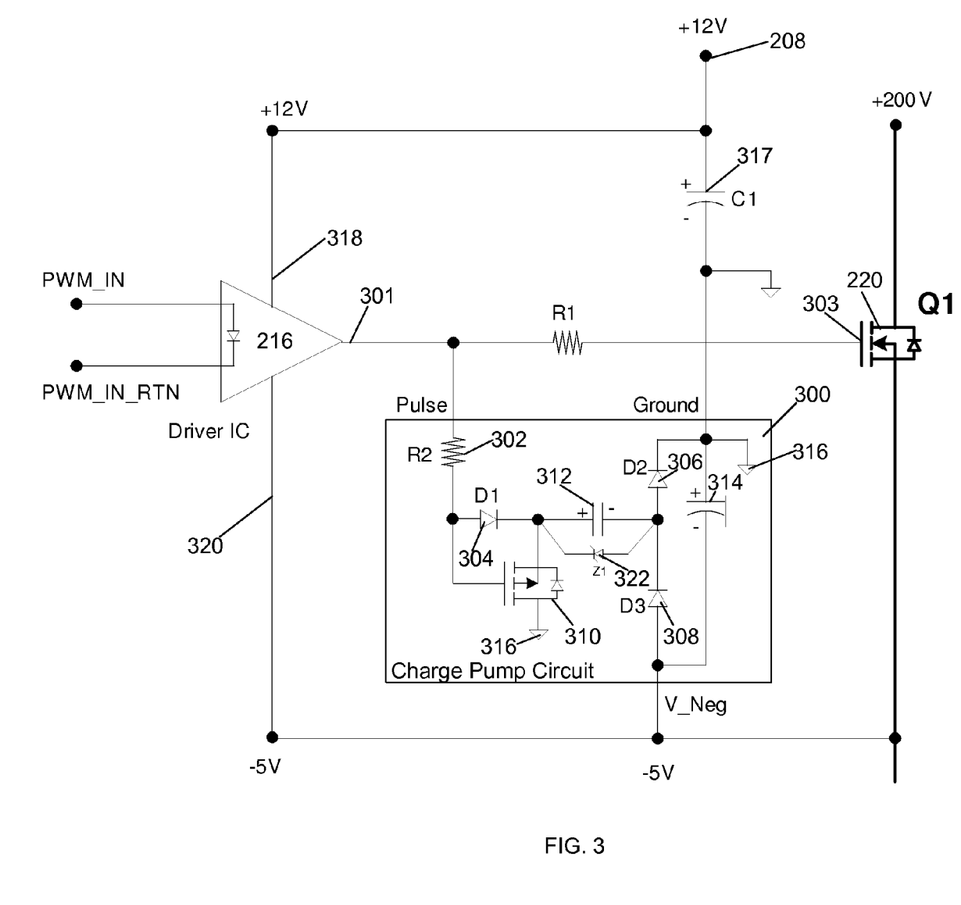
FIG. 3 is a block diagram of a charge pump circuit according to aspects of the present invention.

As discussed above, in one embodiment, the high and/or low side −5V power supplies 210, 214 are separate power supplies; however, in other embodiments, the −5V power supply voltages may be generated from another power supply. For example, FIG. 3 is a block diagram of a charge pump circuit 300 that is configured to generate a −5V power supply voltage from a +12V power supply used in at least one embodiment.

The charge pump circuit 300 includes a resistor 302, a first diode 304, a second diode 306, a third diode 308, a switch 310, a first capacitor 312, and a second capacitor 314. The resistor 302 is coupled to an output 301 of a high or low side driver of a high and low side driver chip (e.g., the high side driver 216 of the high and low side driver chip 206 described above with regard to FIG. 2). The output 301 of the driver 216 is also coupled to a gate terminal 303 of a semiconductor device (e.g., semiconductor device (Q1) 220 described above with regard to FIG. 2).

The first diode 304 is coupled between the resistor 302 and a positive terminal of the first capacitor 312. The switch 310 is coupled between ground 316 and the positive terminal of the first capacitor 312. In one embodiment, the switch 310 is a P-channel Field-Effect Transistor (FET); however, in other embodiments, any other type of switch 310 or transistor may be utilized. The second diode 306 is coupled between a negative terminal of the first capacitor 312 and ground 316. Ground 316 is also coupled to a negative terminal of a supply capacitor 317. The positive terminal of the supply capacitor 317 is coupled to a +12V power supply (e.g., the high side +12V power supply 208 as discussed above with regard to FIG. 2).

The high side +12V power supply 208 is also coupled to a supply input 318 of the high side driver 216. The third diode 308 is coupled between the negative terminal of the first capacitor 312 and the ground input 320 of the high side driver 216. A positive terminal of the second capacitor 314 is coupled to ground 316. A negative terminal of the second capacitor 314 is coupled to the ground input 320 of the high side driver 216.

The charge pump circuit 300 generates a −5V power supply voltage across the second capacitor 314 from the available +12V provided by the +12V power supply 208. Initially, when PWM control signals from the PWM controller 224 (and consequently redefined PWM control signals from the digital level shifter circuit 202) are absent, the voltage across the second capacitor is zero and the effective bias supply for the driver chip 206 is +12V (e.g., from the +12V power supply 208). As PWM control signals from the PWM controller 224 are provided to the digital level shifter circuit 202 and redefined PWM control signals are provided to the driver chip 206 (and hence the high side driver 216) from the digital level shifter circuit 202, the high side driver 216 is operated to provide, via the output 301, unipolar PWM pulses to the gate terminal 303 of the semiconductor device 220.

A portion of a high gate drive pulse at the output 301 of the high side driver 216 (e.g., +12V pulse from the +12V power supply 208 provided to the high side driver 216) is provided to the first capacitor 312 via the resistor 302 and the first diode 304 to charge the first capacitor 312. While the first capacitor 312 is charging, the FET 310 remains off. According to one embodiment, the charge pump circuit 300 also includes an optional zener diode 322 coupled between the positive terminal of the first capacitor 312 and the negative terminal of the first capacitor 312. The zener diode 322 may be used to limit the voltage cross the first capacitor 312, and hence the voltage across the second capacitor 314, to a required voltage (e.g., 5V).

A low gate drive pulse at the output 301 of the high side driver 216 turns on the FET 310, thereby discharging the first capacitor 312 and charging the second capacitor 314. The first capacitor 312 is discharged and the second capacitor 314 is charged through a path including the positive terminal of the first capacitor 312, the FET 310, ground 316, the second capacitor 314, the third diode 308, and the negative terminal of the first capacitor 312. The first diode 304 prevents the discharge of the first capacitor 312 in the reverse direction through the high side driver 216.

By charging the first capacitor 312 and discharging it to the second capacitor 314 in this manner, a −5V power supply voltage is generated at the negative terminal of the second capacitor 314. The −5V power supply voltage is provided to the ground input 320 of the high side driver 216 and is utilized by the high side driver 216 to provide bipolar pulses (+12V/−5V) to the gate terminal 303 of the semiconductor device 220. Although a few initial gate drive pulses from the high side driver 216 are unipolar (+12V/0V) (e.g., due to the initial voltage across the first capacitor 312 and the second capacitor 314 being zero), within a relatively short time, the final pulses of the driver 216 are bipolar.

As described above, the charge pump circuit 300 supplies a −5V power supply voltage to the high side driver 216; however, the charge pump circuit 300 may also supply a −5V power supply voltage to the low side driver 218. In such an embodiment, the charge pump circuit 300 may generate the −5V power supply voltage from the low side +12V power supply 212. Also in such an embodiment, in addition to being provided to the ground input 320 of the low side driver 218, the −5V power supply voltage generated at the negative terminal of the second capacitor 314 would also be provided to chip ground 205 to maintain chip ground at −5V.

Figure 4:
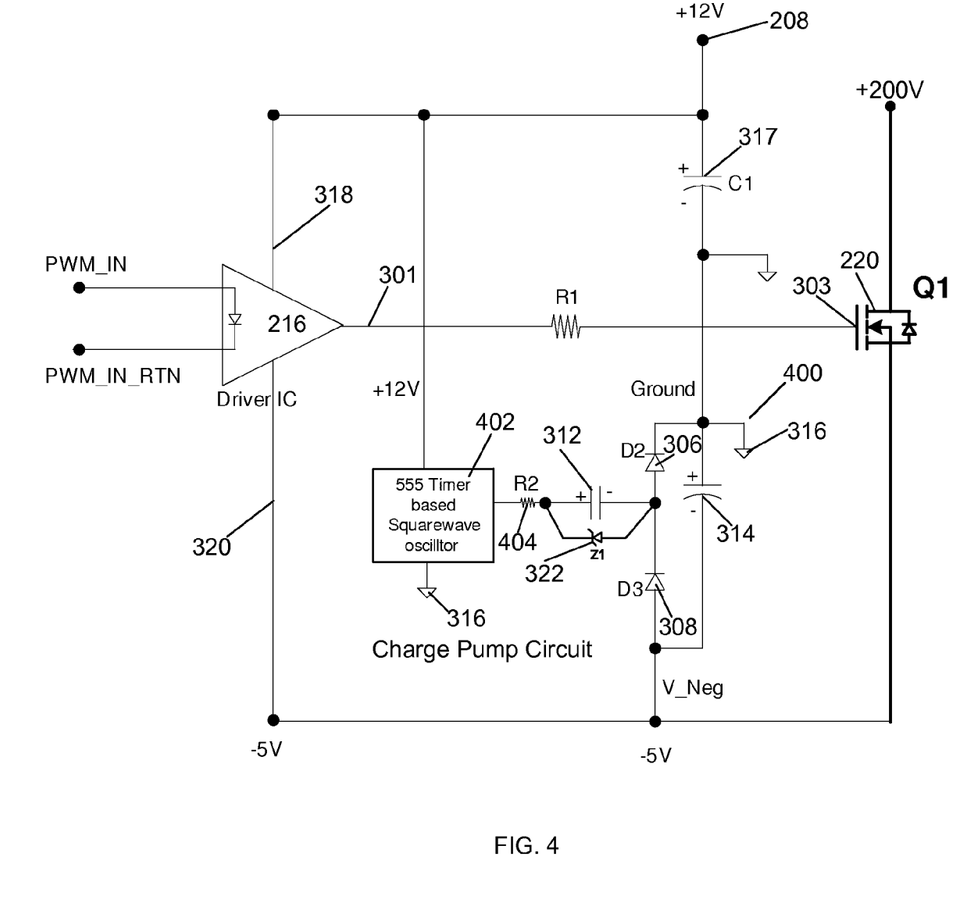
FIG. 4 is a block diagram of an oscillator based charge pump circuit according to aspects of the present invention.

FIG. 4 is a block diagram of another charge pump circuit 400 that is configured to generate a −5V power supply voltage from a +12V power supply. The charge pump circuit 400 is substantially the same as the charge pump circuit 300 described above with regard to FIG. 3, except that in the charge pump circuit 400, the resistor 302, first diode 304, and switch 310 are replaced with an oscillator 402 and a resistor 404. The oscillator 402 is coupled to the high side +12V power supply 208 and the resistor 404 is coupled between the oscillator 402 and the positive terminal of the first capacitor 312. According to one embodiment, the oscillator 402 is a 555 timer based square wave oscillator; however, in other embodiments, another appropriate type of oscillator may be utilized.

Unlike with the charge pump circuit 300, the generation of the negative supply voltage by the charge pump circuit 400 does not depend on gate drive pulses output by the driver 216. Instead, the oscillator 402 provides unipolar high-frequency pulses (e.g., 12V/0V) to the charge pump circuit 400.

A high pulse from the oscillator 402 (e.g., a +12V pulse from the +12V power supply 208 provided to the oscillator 402) is provided to the first capacitor 312 via the resistor 404 to charge the first capacitor 312. A low pulse from the oscillator 402 results in the discharging of the first capacitor 312 and the charging of the second capacitor 314. The first capacitor 312 is discharged and the second capacitor 314 is charged through a path including the positive terminal of the first capacitor 312, the resistor 404, the oscillator 402, ground 316, the second capacitor 314, the third diode 308, and the negative terminal of the first capacitor 312.

By charging the first capacitor 312 and discharging it to the second capacitor 314 in this manner, a −5V power supply voltage is generated at the negative terminal of the second capacitor 314. The −5V power supply voltage is provided to the ground input 320 of the high side driver 216 and is utilized by the high side driver 216 to provide bipolar PWM pulses (+12V/−5V) to the gate terminal 303 of the semiconductor device 220.

As described above, the charge pump circuit 400 supplies a −5V power supply voltage to the high side driver 216; however, the charge pump circuit 400 may also supply a −5V power supply voltage to the low side driver 218. In such an embodiment, the charge pump circuit 400 may generate the −5V power supply voltage from the low side +12V power supply 212. Also in such an embodiment, in addition to being provided to the ground input 320 of the low side driver 218, the −5V power supply voltage generated at the negative terminal of the second capacitor 314 would also be provided to chip ground 205 to maintain chip ground at −5V.

The charge pump circuits 300,400 may be utilized to generate a −5V power supply voltage from a +12V power supply. By generating both a −5V power supply voltage and a +12V power supply voltage from the same +12V power supply, the cost of a gate driver (e.g., gate driver 200) utilizing such a charge pump circuit 300,400 may be reduced as only one power supply per side (e.g., one for the high side of the driver chip 206 and one for the low side of the driver chip 206) would be required.

Figure 5:
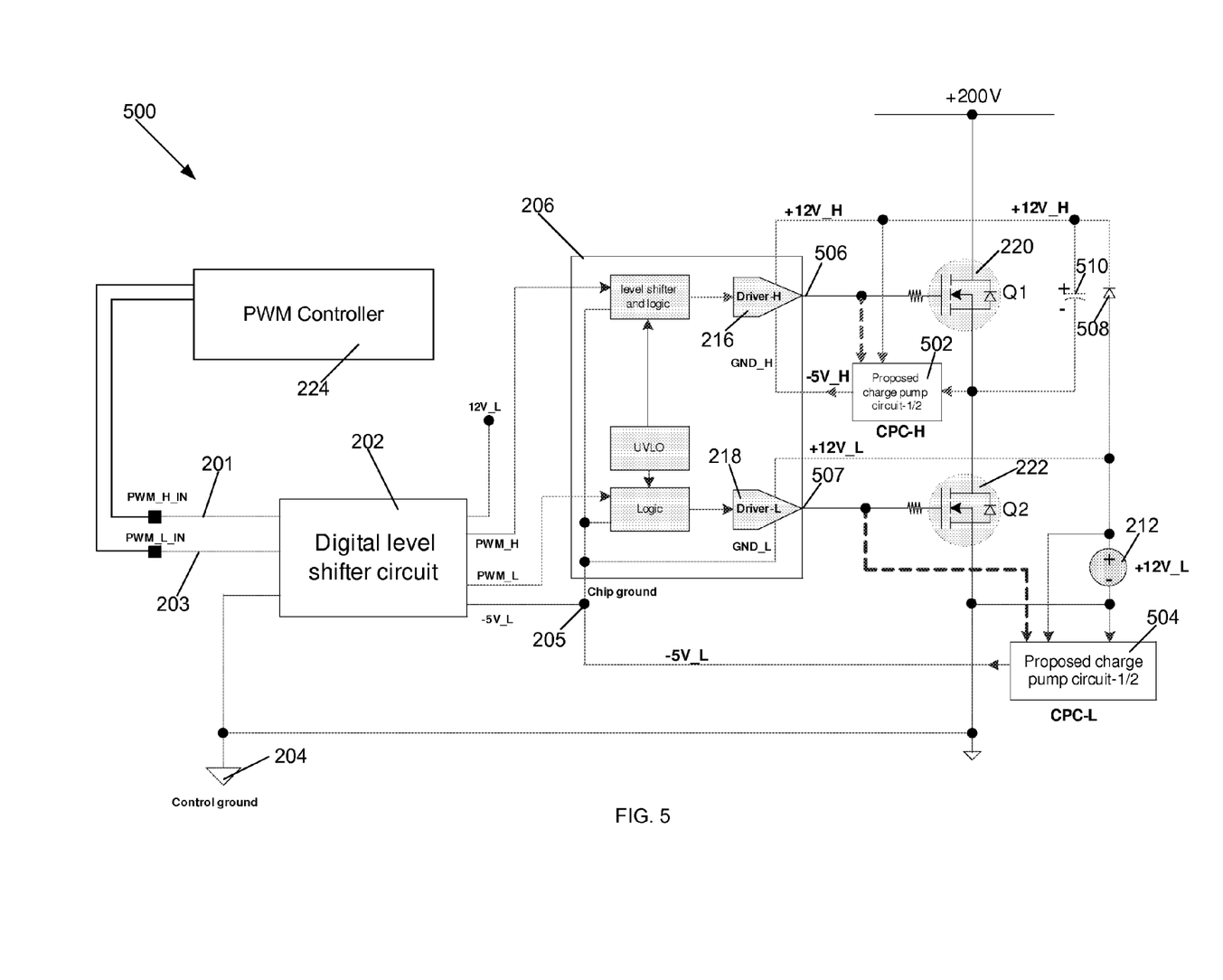
FIG. 5 is a block diagram of a single supply bipolar gate driver according to aspects of the present invention.

As described above, a gate driver including charge pump circuits (e.g., as described above with regard to FIGS. 3 and 4) may include a high side power supply from which both positive and negative high side supply voltages are generated and a low side power supply from which both positive and negative low side supply voltage are generated. In at least one other embodiment, a gate driver may generate both the bipolar high side supply voltage and the bipolar low side supply voltage from a single positive power supply. For example, FIG. 5 is a block diagram of a single supply bipolar gate driver 500.

The single supply bipolar gate driver 500 is substantially the same as the bipolar gate driver 200 discussed above with regard to FIG. 2, except that in the single supply bipolar gate driver 500, the high side +12V power supply 208, high side −5V power supply 210, and low side −5V power supply 214 are replaced with a high side charge pump circuit 502 (e.g., such as one of the charge pump circuits 300, 400 described above with regard to FIGS. 3 and 4), a low side charge pump circuit 504 (e.g., such as one of the charge pump circuits 300, 400 described above with regard to FIGS. 3 and 4), a bootstrap diode 508, and a bootstrap capacitor 510.

The low side charge pump circuit 504 is coupled to the positive and negative terminals of the low side +12V power supply 212, chip ground 205, and an output 507 of the low side driver 218 of the high and low side driver chip 206. The positive terminal of the low side +12V power supply 212 is coupled to the supply input of the high side driver 216 via the bootstrap diode 508. The supply input of the high side driver 216 is also coupled to the high side charge pump circuit 502 via the bootstrap capacitor 510. The high side charge pump circuit 502 is also coupled to the supply input of the high side driver, an output 506 of the high side driver 216, and the ground input of the high side driver 216.

The low side +12V power supply 212 provides +12V power supply voltage to the supply input of the low side driver 218. The low side charge pump circuit 504 generates the negative −5V power supply voltage from the +12V provided by the low side +12V power supply 212 (e.g., as discussed above with regard to FIGS. 3 and 4) and provides the −5V power supply voltage to chip ground 205 (and consequently to the ground input of the low side driver 218).

A +12V power supply voltage, which is provided to the supply input of the high side driver 216, is generated from the low side +12V power supply 212 across the bootstrap capacitor 510 using a bootstrap technique through the bootstrap diode 508. The high side charge pump circuit 502 generates the negative −5V power supply voltage from the +12V power supply voltage generated across the bootstrap capacitor 510 (e.g., as discussed above with regard to FIGS. 3 and 4) and provides the −5V power supply voltage to the ground input of the high side driver 216. Each gate driver 216, 218 feeds bipolar gate drive voltages (e.g., +12V positive drive and −5V negative drive) to its respective semiconductor device 220, 222 of a converter/inverter leg.

By generating bipolar high side supply voltages and bipolar low side supply voltages from a single positive power supply, the cost of a gate driver may be reduced as only one power supply is used.

As described herein, a gate driver is configured to output bipolar pulses to the gate terminals of semiconductor devices in a leg of a converter/inverter; however, in other embodiments, the gate driver may be configured to output bipolar pulses to the gate terminals of semiconductor devices which are utilized in any other application utilizing Pulse Width Modulation. Also, according to other embodiments, the gate driver may be configured to output bipolar pulses to any other type of switching device.

As described herein, a gate driver is configured to output +12V and −5V pulses; however, in other embodiments, the gate driver may be configured to output pulses having different amplitudes. Also as described herein, the gate driver is configured to utilize +12V and −5V power supply voltages; however, in other embodiments, the gate driver may be configured to operate on supply voltages having different amplitudes.

As described herein, a bipolar gate driver provides control signals to two semiconductor devices; however, in other embodiments, the bipolar gate driver may be configured to provide control signals to any number of semiconductor devices. As also described herein, the bipolar gate driver includes two outputs (a high side output and a low side output); however, in other embodiments, the bipolar gate driver may include any number of outputs. As also described herein the bipolar gate driver utilizes a single gate driver chip; however, in other embodiments, any number of driver chips may be utilized.

At least some embodiments described herein provide a bipolar gate driver which utilizes a relatively inexpensive standard high and low side driver chip. According to at least one embodiment, the bipolar gate driver redefines original PWM control signals in relation to a negative chip ground. By redefining the PWM control signals, the driver chip (which typically provides unipolar pulses) may be operated to provide bipolar PWM pulses to the gate terminals of semiconductor devices. By utilizing bipolar gate voltages to control the states of semiconductor devices, the driver chip may prevent accidental shoot-through faults due to oscillations in the gate voltage of an off semiconductor device.

According to at least one embodiment, the bipolar gate driver also includes at least one charge pump circuit configured to generate a negative supply voltage from a positive power supply. By utilizing at least one charge pump circuit, the number of individual power supplies required to power the bipolar gate driver may be reduced.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A gate driver, the gate driver comprising:
    a level shifter circuit configured to be coupled to a controller, to receive control signals from the controller, each control signal having a voltage with respect to a control ground, and to redefine the voltage of each control signal with respect to a chip ground to generate redefined control signals;
    a gate driver chip, coupled to the level shifter circuit and including a high side gate driver and a low side gate driver, the high side gate driver configured to be coupled to a first semiconductor device and configured to provide first bipolar control signals to the first semiconductor device based on the redefined control signals, and the low side gate driver configured to be coupled to a second semiconductor device and being configured to provide second bipolar control signals to the second semiconductor device based on the redefined control signals; and
    a power source including a positive power supply and being coupled to the gate driver chip and the chip ground, the power source configured to provide a first positive supply voltage and a first negative supply voltage to the high side driver, to provide a second positive supply voltage to the low side driver, and to provide a second negative supply voltage to the low side driver and to the chip ground, wherein the power source is further configured to derive the first positive supply voltage, the first negative supply voltage, the second positive supply.

2. The gate driver of claim 1, wherein the power source includes:
    a first charge pump circuit coupled to the positive power supply, the gate driver chip, and the chip ground, the first charge pump circuit configured to generate the first negative supply voltage from the positive supply voltage and provide the first negative supply voltage to the gate driver chip and to the chip ground.

3. The gate driver of claim 2, wherein the gate driver chip includes:
    the high side driver coupled to the level shifter circuit and having a first output configured to be coupled to the first semiconductor device, the high side driver further configured to provide the first bipolar control signals to the first semiconductor device via the first output based on the redefined control signals; and
    the low side driver coupled to the level shifter circuit and having a second output configured to be coupled to the second semiconductor device, the low side driver further configured to provide the second bipolar control signals to the second semiconductor device via the second output based on the redefined control signals,
    wherein the first charge pump circuit is coupled to the high side driver and configured to provide the first negative supply voltage to the high side driver.

4. The gate driver of claim 3, wherein the power source further includes a second charge pump circuit coupled to the positive power supply and the low side driver, the second charge pump circuit configured to generate the second negative supply voltage from the voltage of the positive power supply and provide the second negative supply voltage to the low side driver.

5. The gate driver of claim 4, wherein the first charge pump circuit is coupled to the positive power supply and configured to generate the first negative supply voltage from the voltage of the positive power supply, and wherein the second charge pump circuit is coupled to the positive power supply and configured to generate the second negative supply voltage from the voltage of the positive power supply.

6. The gate driver of claim 4, wherein the first charge pump circuit comprises:
    a first capacitor coupled to the second output;
    a switch coupled between the second output and the first capacitor; and
    a second capacitor coupled to the first capacitor and to the chip ground,
    wherein in a first mode of operation, the switch is turned off by high control signals at the second output and the first capacitor is charged by the high control signals, and
    wherein in a second mode of operation, the switch is turned on by low control signals at the second output, the first capacitor discharges, and discharged energy from the first capacitor charges the second capacitor, generating the first negative supply voltage on the chip ground.

7. The gate driver of claim 4, wherein the first charge pump circuit comprises:
    an oscillator coupled to the positive power supply;
    a first capacitor coupled to the oscillator; and
    a second capacitor coupled to the first capacitor and to the chip ground,
    wherein in a first mode of operation, the oscillator provides a high pulse signal to the first capacitor and the first capacitor is charged by the high pulse signal, and
    wherein in a second mode of operation, the oscillator provides a low pulse signal to the first capacitor, the first capacitor discharges, and discharged energy from the first capacitor charges the second capacitor, generating the first negative supply voltage on the chip ground.

8. A method for operating a gate driver chip including a high side gate driver coupled to a first semiconductor device and a low side gate driver coupled to a second semiconductor device, the method comprising:
    receiving control signals from a controller, each control signal having a voltage with respect to a control ground;
    redefining the voltage of each control signal with respect to a chip ground to generate redefined control signals;
    generating, with the gate driver chip based on the redefined control signals, first bipolar control signals and second bipolar control signals;
    providing, with the high side gate driver, the first bipolar control signals to the first semiconductor device;
    providing, with the low side gate driver, the second bipolar control signals to the second semiconductor device;
    generating, with a power source including a positive power supply, a first positive supply voltage, a first negative supply voltage, a second positive supply voltage, and a second negative supply voltage, the first positive supply voltage, the first negative supply voltage, the second positive supply voltage, and the second negative supply voltage being derived from a voltage of the positive power supply;

providing, with the power source, the first positive supply voltage and the first negative supply voltage to the high side driver; and providing, with the power source, the second positive supply voltage and the second negative supply voltage to the low side driver.

9. The method of claim 8, wherein providing the first positive supply voltage to the high side driver of the gate driver chip includes bootstrapping the second positive supply voltage to generate the first positive supply voltage.

10. The method of claim 9, wherein generating the second negative supply voltage includes operating a charge pump circuit to generate the second negative supply voltage from the second positive supply voltage.

11. The method of claim 10, wherein operating the charge pump circuit includes:

charging, in a first mode of operation, a first capacitor in the charge pump circuit;

discharging, in a second mode of operation, the first capacitor;

charging, in the second mode of operation, a second capacitor in the charge pump circuit with discharged energy from the first capacitor; and generating, with the charged second capacitor, the second negative supply voltage.

12. The method of claim 11, wherein charging the first capacitor in the charge pump circuit includes charging the first capacitor with energy from an output of the low side driver.

13. The method of claim 11, wherein charging the first capacitor in the charge pump circuit includes charging the first capacitor with energy from an oscillator in the charge pump circuit.

14. A gate driver, the gate driver comprising:

a gate driver chip including a high side gate driver and a low side gate driver, the gate driver chip configured to be coupled to a controller, to a first semiconductor device, and to a second semiconductor device, and means for operating the high side gate driver to provide first bipolar control signals to the first semiconductor device and for operating the low side gate driver to provide second bipolar control signals to the second semiconductor device based on unipolar control signals received from the controller, for providing a first positive supply voltage and a first negative supply voltage to the high side gate driver and for providing a second positive supply voltage and a second negative supply voltage to the low side gate driver, wherein the first positive supply voltage, the first negative supply voltage, the second positive supply voltage, and the second negative supply voltage are derived from a positive voltage from a single power supply.

* * * * *